United States Patent
Pascucci et al.

(10) Patent No.: US 6,175,521 B1
(45) Date of Patent: *Jan. 16, 2001

(54) VOLTAGE REGULATOR FOR PROGRAMMING ELECTRICALLY PROGRAMMABLE NON-VOLATILE MEMORY CELLS IN A CELL MATRIX

(75) Inventors: Luigi Pascucci, Sesto San Giovanni; Marco Fontana, Milan, both of (IT)

(73) Assignee: SGS-Thomson Microelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/833,336

(22) Filed: Apr. 4, 1997

(30) Foreign Application Priority Data

Apr. 5, 1996 (EP) ................................................ 96830192

(51) Int. Cl.[7] ...................................................... G11C 16/04
(52) U.S. Cl. .............................. 365/185.18; 365/185.21; 365/185.23
(58) Field of Search ........................ 365/185.18, 185.2, 365/185.23, 185.21

(56) References Cited

U.S. PATENT DOCUMENTS

| | | | |
|---|---|---|---|
| 5,519,656 | * 5/1996 | Maccarrone et al. | 365/189.09 |
| 5,576,990 | * 11/1996 | Camerlenghi et al. | 365/185.23 |
| 5,610,506 | * 3/1997 | McIntyre | 323/313 |
| 5,627,493 | * 5/1997 | Takeuchi et al. | 327/546 |
| 5,659,502 | * 8/1997 | Sali et al. | 365/185.18 |
| 5,687,116 | * 11/1997 | Kowshik et al. | 365/185.03 |
| 5,701,272 | * 12/1997 | Brennan, Jr. | 365/230.06 |
| 5,706,240 | * 1/1998 | Fiocchi et al. | 365/226 |
| 5,710,740 | * 1/1998 | Manning | 365/222 |
| 5,777,926 | * 7/1998 | Trinh et al. | 365/185.19 |
| 5,781,474 | * 7/1998 | Sali et al. | 365/185.18 |
| 5,784,319 | * 7/1998 | Villa et al. | 365/185.33 |
| 5,793,679 | * 8/1998 | Caer et al. | 365/185.27 |
| 5,905,677 | * 5/1999 | Casagrande et al. | 365/185.23 |

FOREIGN PATENT DOCUMENTS

| | | | |
|---|---|---|---|
| 0 576 774 | 1/1994 | (EP) | G11C/16/06 |
| 0 661 717 | 7/1995 | (EP) | G11C/16/06 |

OTHER PUBLICATIONS

European Search Report from European Patent Application 96830192.9, filed Apr. 5, 1996.
Patent Abstracts of Japan, vol. 9, No. 210 (P–383), Aug. 28, 1985 & JP–A–60 070597 (Toshiba KK).

* cited by examiner

*Primary Examiner*—Richard Elms
*Assistant Examiner*—Hien Nguyen
(74) *Attorney, Agent, or Firm*—Wolf, Greenfield & Sacks, P.C.; James H. Morris; Theodore E. Galanthay

(57) ABSTRACT

A voltage regulator for programming electrically programmable non-volatile memory cells in a cell matrix that is divided in segments. The voltage regulator includes an amplifier stage connected and powered between a first reference voltage and a second reference voltage and having a first input terminal connected to a voltage divider of the first reference voltage, an output terminal connected to the control terminal of a MOS transistor which has a conduction terminal connected to the memory cells through a programming line, and a second input terminal connected to the programming line, and connected to the output terminal in a feedback loop. The voltage regulator includes an input circuit portion made up of active elements and inserted in turn between the first and second reference voltages. The input circuit portion connects the amplifier to the first reference voltage in response to at least one pair of signals to activate the voltage regulator only when there is at least one cell to be programmed in the segment that is associated with the regulator.

31 Claims, 5 Drawing Sheets

VOLTAGE REGULATOR FOR PROGRAMMING ELECTRICALLY PROGRAMMABLE NON-VOLATILE MEMORY CELLS IN A CELL MATRIX

BACKGROUND OF THE INVENTION

1. Field of the Invention

The present invention relates to a voltage regulator for appropriate biasing of electrically programmable non-volatile memory cells. More specifically, the present invention concerns a voltage regulator for programming electrically programmable non-volatile memory cells, wherein the voltage regulator includes an amplifier stage connected and powered between a first and a second reference voltage and having a first input terminal connected to a voltage divider of the first reference voltage, an output terminal connected to the control terminal of a MOS transistor which has its conduction terminal connected to the memory cells through a programming line, and a second input terminal connected to the programming line and connected to the output terminal in a feedback loop.

2. Discussion of the Related Art

As known, electrically programmable non-volatile memory cells are structured in cell matrices, each cell of which includes a floating gate MOS transistor with related drain and source regions. The floating gate is provided over the semiconductor substrate and is separated therefrom by a thin layer of gate oxide. A control gate is capacitatively coupled to the floating gate through a dielectric layer. Metal electrodes are provided for contacting the drain, the source and the control gate to be able to apply predetermined voltage values to the memory cell. By appropriately biasing the cell terminals it is possible to vary the quantity of charge present in the floating gate. The operation by means of which charge is stored in the floating gate is termed 'programming' and consists of biasing the drain terminal and the control gate at a predetermined value higher than the potential of the source terminal.

Normally a memory device integrated on a semiconductor substrate includes a very large number of cells of the above mentioned type. The cells are organized in a matrix having rows (termed 'word lines') and columns (termed 'bit lines'). The cells belonging to the same word line have a common electric line which drives the respective control gates while the cells belonging to the same bit line have common drain terminals.

The programming of a single memory cell is strongly influenced by the voltage Vpd present on the drain terminal, that is, by the voltage present on the bit line to which it belongs. It is also known that for flash memory cells, a reduced drain voltage value Vpd can result in insufficient or slow cell programming. However, an excessive drain voltage value Vpd can release destructive 'snap-back' phenomena or cause partial erasing of the cell, the latter this phenomenon being more commonly known as 'soft-erasing'.

The optimal voltage interval for the drain voltage Vpd is rather small, with variations on the order of 200 to 300 millivolts with respect to a typical level, where the typical level varies according to the particular technology used. Thus, the memory device should be equipped with a very refined and accurate voltage regulator to supply the correct voltage to the bit lines during programming. This requirement becomes even more critical when there are a plurality of cells to be programmed simultaneously and in parallel, for example, to reduce the time and cost of the programming operation during testing. In addition, the value of the drain voltage Vpd should be held steady during programming.

It has been found that variations in the drain voltage during programming are essentially linked to the following phenomena: technological variations that are linked to the manufacturing process of the various components of the memory device, an increase in the threshold voltage of the cells during programming and the resulting reduction in the absorbed current, a voltage drop on the power supply line of the programming voltage Vpp, and a voltage drop on the selection transistors present on the bit lines. This last effect can be particularly significant in large-capacity memories in which the selection transistors have a high series resistance. Thus, there is a need to provide a drain voltage regulator accounting for all these phenomena.

The prior art has already proposed different solutions for facing these problems. For example, a typical solution proposed by the prior art provides a regulator whose output voltage is a little higher than that desired on the bit line. The difference in voltage depends instant by instant on the current which actually traverses the selection transistors of the bit line. A regulator of this type is provided by an adaptive biasing technique and through a positive feedback structure. An example of this prior art solution is described in European patent application No. 93830545.5 filed by this same applicant. Although advantageous in some ways, this prior art solution performs its control action on the entire collection of cells and does not allow for a high degree of programming parallelism which could then accelerate the testing phase of the memory device.

SUMMARY OF THE INVENTION

According to embodiments of the present invention, it is an object to conceive a voltage regulator having structural and functional characteristics to allow holding constant the drain voltage Vpd in the parallel programming phase of a plurality of memory cells to accelerate the testing phases of the memory device and overcome the shortcomings pointed out with reference to the current solutions of the prior art.

According to an embodiment of the present invention, a voltage regulator for programming electrically programmable non-volatile memory cells in a cell matrix that is divided in segments includes an amplifier stage and an input circuit portion made up of active elements. The amplifier stage is connected and powered between a first reference voltage terminal that supplies a first reference voltage and a second reference voltage terminal that supplies a second reference voltage. The amplifier stage has a first input terminal connected to a voltage divider of the first reference voltage, an output terminal connected to a control terminal of a MOS transistor which has a conduction terminal connected to the memory cells through a programming line, and a second input terminal connected to the programming line and in feedback to the output terminal. The input circuit portion is inserted between the first and second reference voltage terminals and acts on a connection between the amplifier and the first reference voltage terminal. In response to at least one pair of signals, the input circuit portion activates the regulator only when there is at least one cell to be programmed in the segment associated with the regulator.

According to another embodiment of the present invention, a voltage regulator that provides a regulated programming voltage to a plurality of electrically programmable non-volatile memory cells includes an output transistor, a voltage divider, an amplifier, and a first switching circuit. The memory cells are arranged in cell matrix, each memory cell belonging to a respective one of a plurality of bit lines, the memory cells belonging to a same bit line having a drain terminal that is commonly connected to form a common drain terminal. The output transistor has a first terminal that is coupled to a first reference voltage terminal, a second terminal that is coupled to the common drain terminal, and a control terminal. The voltage divider is coupled between the first reference voltage terminal and a second reference voltage terminal and has an output terminal to provide a divided output voltage. The amplifier has a first input that is coupled to the output terminal of the voltage divider, a second input that is coupled to the common drain terminal, and an output that is coupled to the control terminal of the output transistor and provides the regulated programming voltage. The first switching circuit is coupled between the first reference voltage terminal and the second reference voltage terminal to receive a programming enablement signal and operatively connect the amplifier to the first and second reference voltage terminals to provide the regulated programming voltage only when at least one of the plurality of memory cells is programmed.

According to another embodiment of the present invention, a method of providing a regulated programming voltage to an electrically programmable non-volatile memory cell that is arranged in a cell matrix is described. The cell matrix is divided into a plurality of segments and the method includes generating a divided voltage from a programming voltage, receiving a first signal indicative of a programming phase, determining whether the memory cell is arranged in a respective segment of the cell matrix that is associated with a respective amplifier, and operatively connecting, in response to the steps of receiving and determining, the respective amplifier between a pair of voltage supply terminals to provide the regulated programming voltage to the memory cell when the memory cell is determined to be arranged in the respective segment of the cell matrix.

According to a further embodiment of the present invention, an electrically programmable non-volatile memory includes a plurality of electrically programmable non-volatile memory cells arranged in a cell matrix, an output transistor, a voltage divider, and means for individually regulating a programming voltage. The cell matrix is divided into a plurality of segments, each memory cell belonging to a respective segment of the plurality of segments, each memory cell having a drain terminal that is coupled to a respective one of a plurality of bit lines. The memory cells belonging to a same bit line having a drain terminal that is commonly connected and form a common drain terminal. The output transistor has a first terminal that is coupled to a first reference voltage terminal, a second terminal that is coupled to the common drain terminal, and a control terminal. The voltage divider is coupled between the first reference voltage terminal and a second reference voltage terminal and has an output terminal to provide a divided output voltage. The means for individually regulating the programming voltage is coupled to the output terminal of the voltage divider and the control terminal of the output transistor and individually regulates the programming voltage that is provided to the common drain terminal of the respective segment.

BRIEF DESCRIPTION OF THE DRAWINGS

A preferred, non-limiting embodiment of the present invention will be described by way of example with reference to the accompanying drawings, in which.

DETAILED DESCRIPTION

Figure 1:
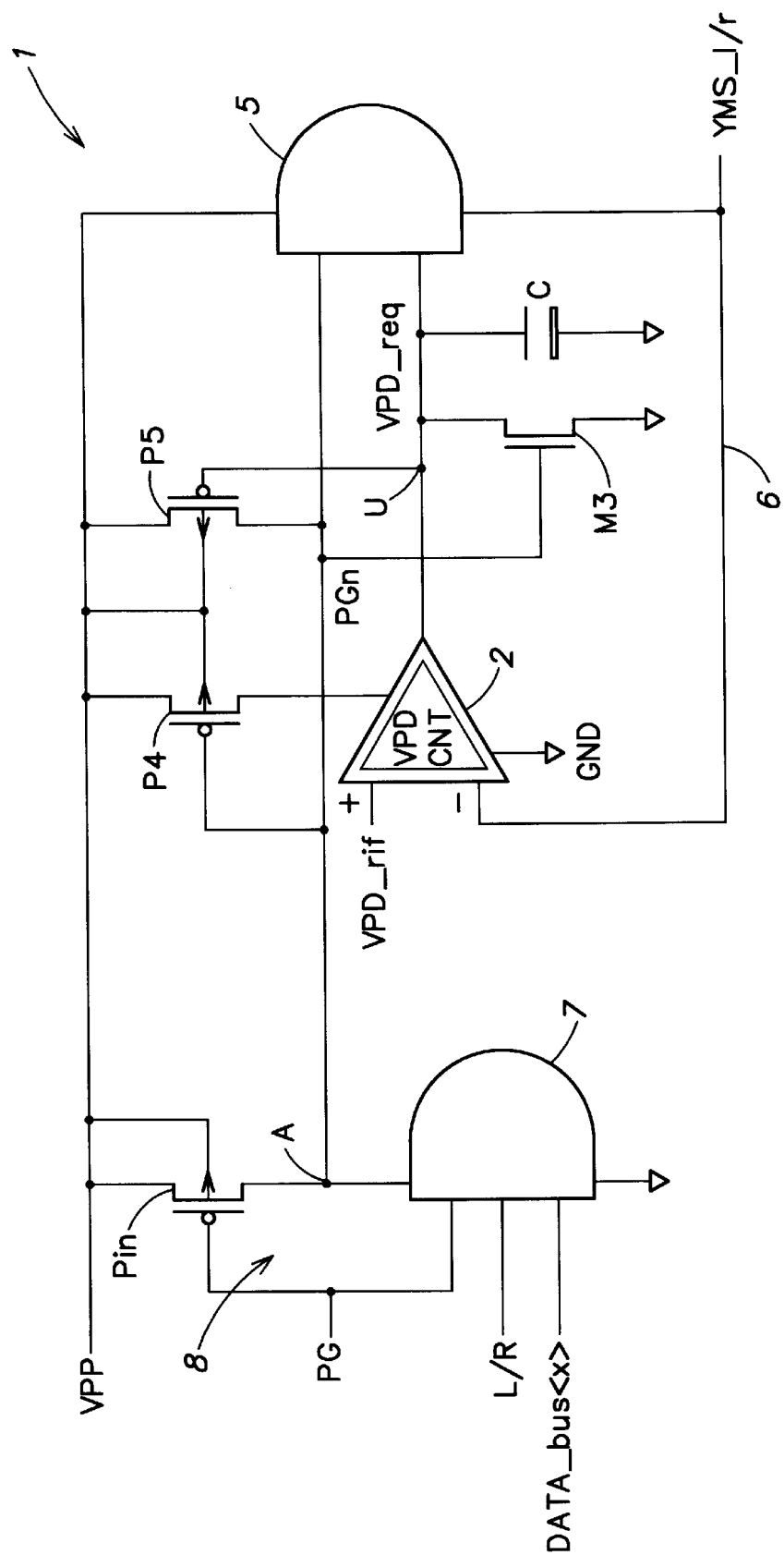
FIG. 1 shows a diagrammatic view of a voltage regulator according to an embodiment of the present invention.
Figure 6:
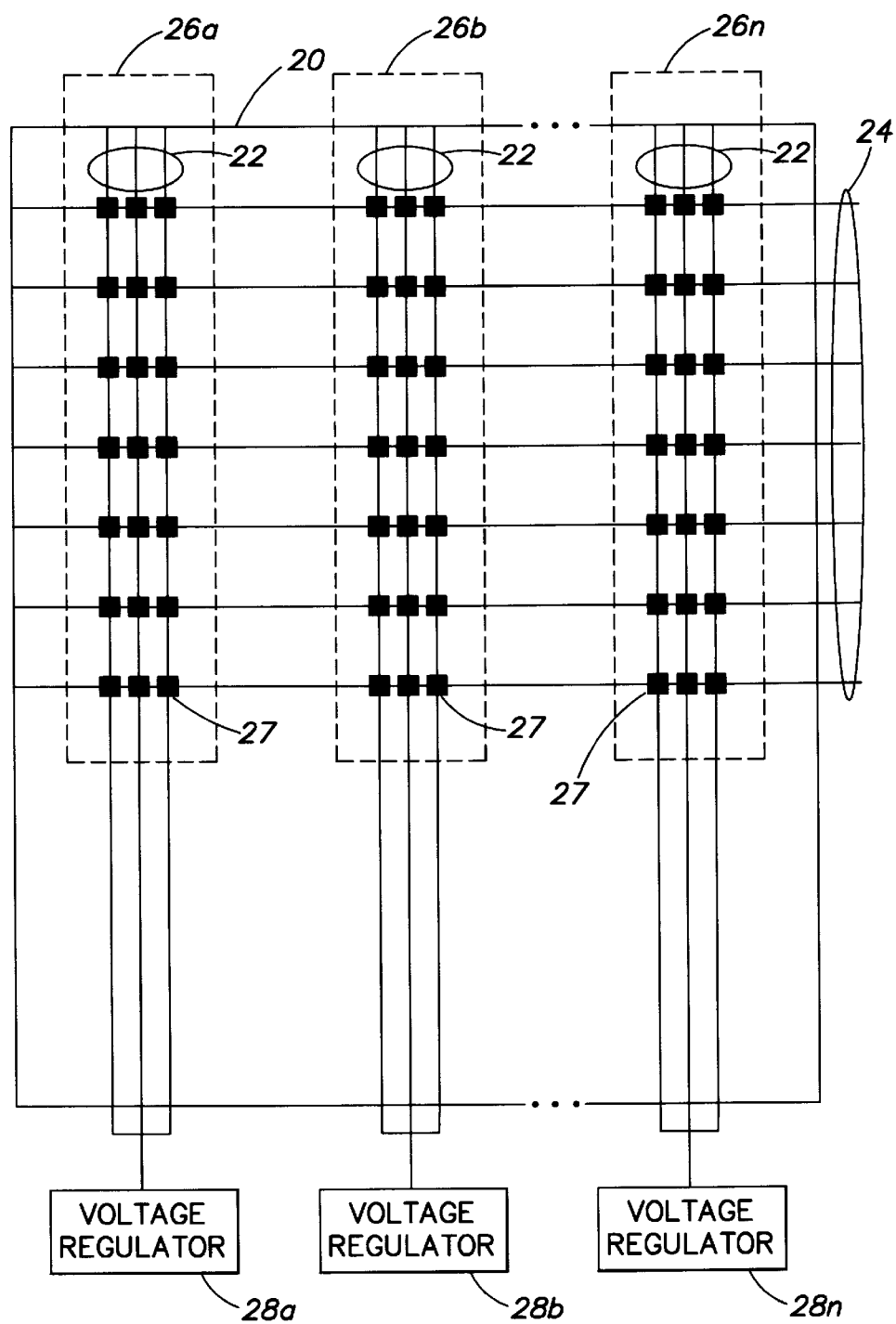
FIG. 6 shows a diagram of a memory divided into sections.

With particular reference to the example of FIG. 1, reference number 1 indicates a voltage regulator according to an embodiment of the present invention for biasing, in an appropriate manner, the terminals of electrically programmable and erasable non-volatile memory cells, for example flash EPROM cells. The cells are organized in a matrix as shown in FIG. 6. The cell matrix 20 is of the type having rows 22—termed word lines—and columns 24—termed bit lines. The cells belonging to the same bit line have in common their respective drain terminals. As is conventional, a memory cell make be located at each intersection of a row and a column (the individual cells are not shown for sake of clarity). The matrix 20 is divided into segments 26a, 26b, . . . 26n where each segment includes a portion of the cells 27 that make up the matrix 20. Each segment 26a, 26b . . . 26n may be coupled to a voltage regulator 28a, 28b . . . 28n.

Referring again to FIG. 1, the regulator 1 is designed specifically, but not exclusively, for a flash memory device with cell matrices having dimensions quantifiable in 16 megabytes divided in 16 1 Mbit segments each with 16-bit memory words.

The topography of the memory device integrated on a semiconductor substrate provides two distinct portions of matrix segments separated by a sort of central corridor in which is housed selection and decoding circuitry as well as an assembly of sense amplifiers for reading and checking the contents of the cells. Advantageously an assembly of electrical connections BUS extends along the central corridor to allow passage of data and/or electrical signals away from and towards the above mentioned circuitry. According to an embodiment of the present invention, a voltage regulator is provided for each segment of the memory matrix. The various voltage regulators have the same structure, and the structure of only one of them is described below.

The voltage regulator 1 is powered between a first reference voltage Vpp and a second reference voltage GND. The first reference voltage Vpp is a programming voltage of approximately 12V to be applied in the programming phase to the word line of the cells matrix. The second reference voltage is a signal ground GND. The regulator 1 incorporates high voltage transistors.

The voltage regulator 1 includes an appropriately fedback operational amplifier 2. The amplifier 2 has a first non-inverting input (+) on which is applied a reference voltage VPD-rif taken from a divider 3 of the programming voltage Vpp.

Figure 3:
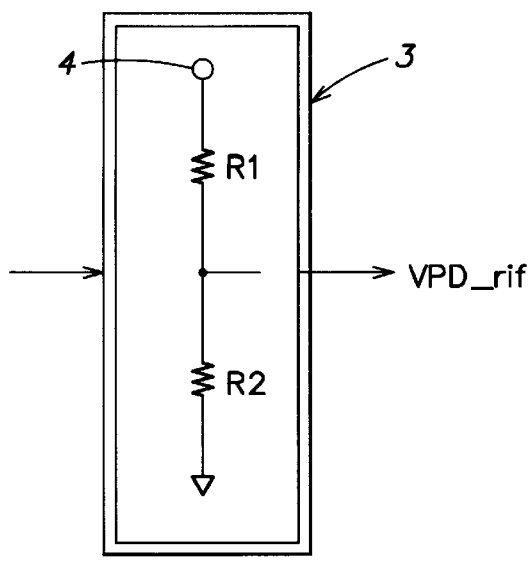
FIG. 3 shows a diagrammatic view of a voltage divider associated with the regulator of FIG. 1 according to an embodiment of the present invention.

Referring to FIG. 3, the divider 3 includes at least two resistances R1 and R2 of the integrated type and is provided with a pad 4, that is to say, a contact terminal of the integrated memory device, on which is directly applied the voltage value Vpp. In this manner the divider 3 takes voltage directly from the power supply Vpp. Advantageously, as shown in FIG. 3, the divider 3 is enabled by a signal PG for enablement of the programming phase.

Figure 4:
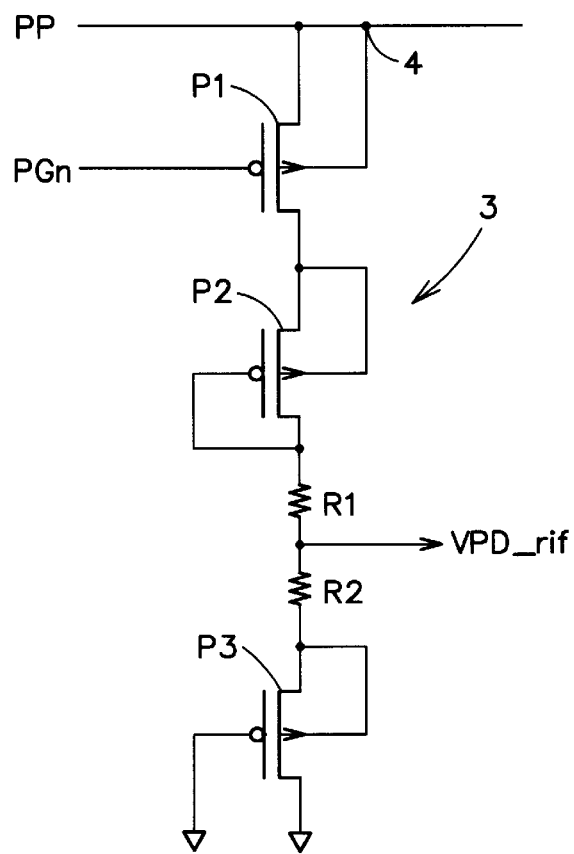
FIG. 4 shows a diagrammatic view in greater detail of the voltage divider of FIG. 3.

More specifically, and as shown in FIG. 4, the divider 3 includes a pair of PMOS transistors P1 and P2 connected in series between the first resistance R1 and the terminal 4. These transistors P1 and P2 are in diode configuration and the first of these P1 receives on its control terminal a signal PGn which is the logical negation (inverse) of the programming start signal PG. A third PMOS transistor P3 is connected between the second resistance R2 and ground GND. Even this transistor P3 is in diode configuration and has its control terminal grounded.

Figure 2:
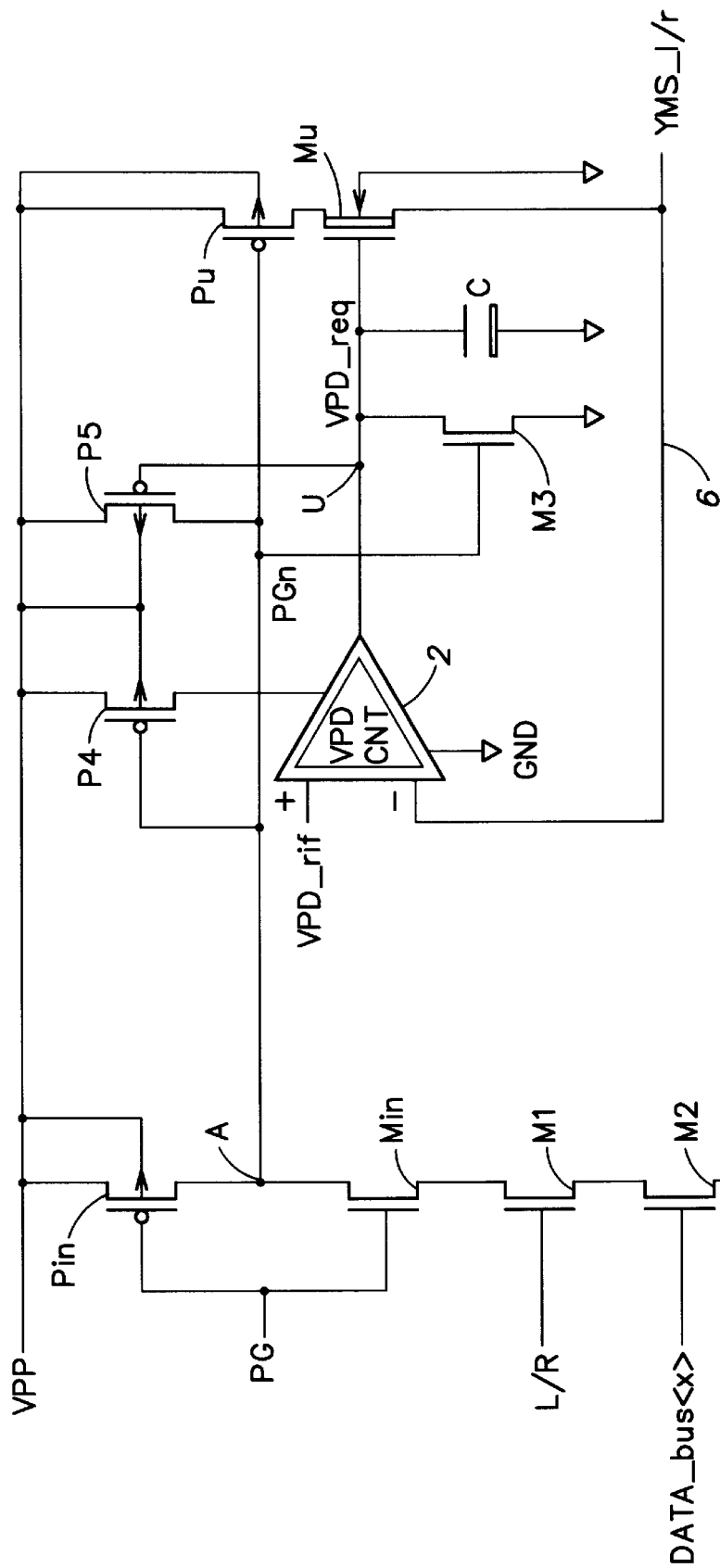
FIG. 2 shows another diagrammatic view in greater circuit detail of the regulator of FIG. 1.

Referring back to FIG. 1, the amplifier 2 of the regulator 1 has an output U connected to an output switch 5 including a complementary pair of transistors Pu and Mu (see FIG. 2). On the output U is produced a signal VPD-reg which is the result of the regulation performed by the circuit 1.

As shown in FIG. 2, the transistors Pu and Mu are connected between the power supply Vpp and a programming line 6 connected to the bit line of the memory matrix. The line 6 is also connected to the second inverting input (−) of the amplifier 2 to provide a feedback loop. The output U of the amplifier 2 is connected to the control terminal of the transistor Mu which is a natural NMOS type of transistor with its body terminal grounded and its source terminal connected to the line 6. The other transistor Pu of the switch 5 is the PMOS type and its body terminal is connected to the power supply Vpp and its control terminal is connected to circuit node A which is driven by an input switch 7 and by a pull-up transistor Pin.

In particular, the node A is connected to the power supply Vpp through the transistor Pin of the PMOS type which has its source and body terminals connected to the power supply Vpp and its drain terminal connected to the node A. On the control terminal of the transistor Pin is applied the programming signal PG. As shown in FIG. 2, this signal is also applied to the control terminal of a NMOS transistor Min connected to the node A and forming a complementary pair with the above transistor Pin. Two other NMOS transistors M1 and M2 are connected in series with the transistor Min towards ground. The transistors Min, M1 and M2 virtually form the above mentioned input switch 7.

Basically, the regulator 1 includes an input circuit portion 8 made up of active elements Pin, Min, M1, M2 and inserted in turn between the reference voltages Vpp and GND. The input portion 8 made up of the transistors Pin, Min, M1 and M2 is of a pseudo-CMOS type because the CMOS structure of the transistors Pin and Min is enabled by the high voltage signal PG, while the remaining pair of NMOS transistors is enabled by 3V or 5V low voltage control terminals.

The first transistor M1 of the NMOS pair M1, M2 receives on its control terminal a signal L/R for enablement of the programming of a left or right segment of the memory cells matrix. The presence of this transistor M1 is fully optional. The second transistor M2 receives on its control terminal a signal DATA-bus<X> which indicates the presence of a bit to be programmed. Hereafter, the signal DATA-bus <X> is indicated by the shorter symbol DI.

The input circuit portion 8 acts on the connection between the amplifier 2 and the first reference voltage Vpp enabled by the signals PG, DI and possibly L/R to activate the regulator only when there is at least one cell to be programmed in the segment associated with the regulator. For this purpose the structure of the regulator 1 includes additional transistors as specified below.

A power supply transistor P4 is connected between the power supply Vpp and the amplifier 2. This transistor is the PMOS type with its control terminal connected to the node A. The input circuit portion 8 acts on this transistor P4 to activate or deactivate the regulator. The body terminal of the transistor P4 is in common with the body terminal of an enablement transistor P5 inserted between the power supply Vpp and the control terminal of the transistor Pu. These body terminals are connected to the power supply Vpp. The control terminal of the transistor P5 is connected to the output U of the amplifier 2. This transistor operates essentially as a static and resistive pull-up. Lastly, a protection transistor M3 of the NMOS type connects the output U to ground. In parallel with this transistor there is a capacitor C. This capacitor C is designed to erase any overshoots when the dynamics of the output U are too fast. The control terminal of the transistor M3 is connected to the node A.

Figure 5:
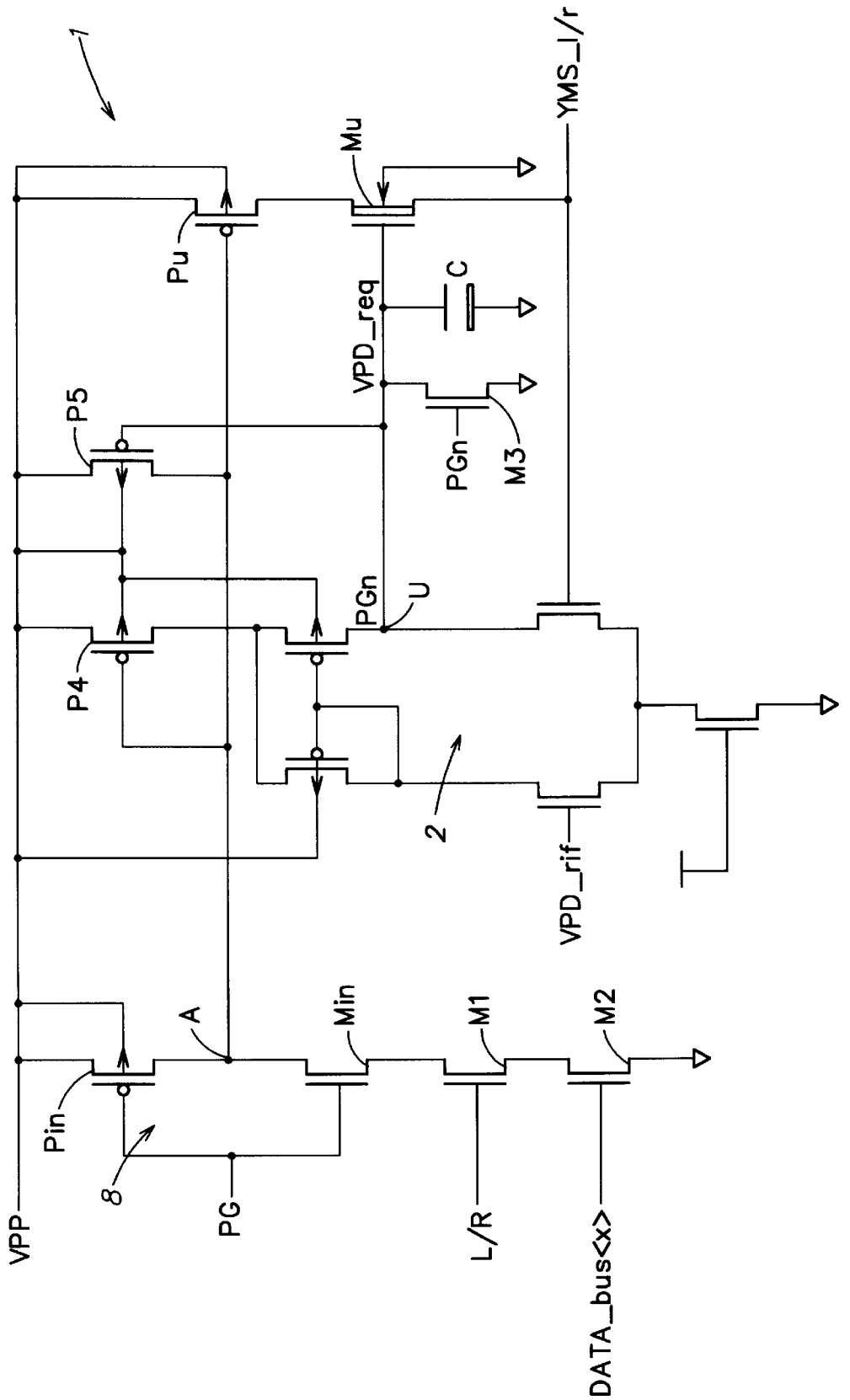
FIG. 5 shows a diagrammatic view of other circuit details of a voltage regulator according to an embodiment of the present invention.

In FIG. 5 details of the voltage regulator 1 in accordance with an embodiment of the present invention are shown in detail, including the structure of the amplifier 2. Those skilled in the art will appreciate the fact that the amplifier 2 is fairly conventional and is made up of a differential cell of MOS transistors polarized by a current mirror.

The operation of the voltage regulator 1 in accordance with embodiments of the present invention are as follows. When the signal PG which controls the starting of the programming phase is at a low logical value the node A moves to a high logical value. The node A represents the virtual output of the CMOS input inverter made up of the transistors Pin and Min. Therefore, on the control terminal of the transistor P4 is applied a high signal and therefore the transistors P4 and P5 are turned off. Under these conditions the amplifier 2 is turned off while the transistor M3 is on and grounds the output U of the amplifier 2. Consequently the signal VPD-reg has ground value, that is to say 0V, and the line 6 will not see current since even transistors Pu and Mu are completely turned off. It is important to note that when the output U is grounded the amplifier 2 is not powered and does not consume current.

In contrast, when the signal PG has high logical value, the voltage regulator 1 may be active to regulate the drain voltage VPD-ref on the bit line of the memory cells, but the actual starting of the voltage regulator depends on the presence or absence of a bit to be programmed. Therefore only if the logical signal DI has a high logical value will the transistor M2 be enabled to turn on and allow the node A to take on a low logical value corresponding to the negated signal PGn. Under these conditions the transistor P4 is on and powers the amplifier 2. The transistor M3 is turned off and the regulator 1 acts to power the programming line 6 with a current flowing through the complementary output pair Pu and Mu. The feedback loop connected to the inverting input of the amplifier 2 allows stabilization of the value of VPD-reg depending on the current absorbed by the line 6.

The regulator in accordance with the present invention achieves numerous advantages, the first of which is the fact that the differential amplifier is activated only when a cell is actually to be programmed. In addition, the voltage regulation is performed locally for each segment of the matrix. In this manner the voltage regulation is independent of any voltage drops of the power supply Vpp and is also independent of the location of the various circuit portions to be programmed. The circuit area occupied by the voltage regulators associated with each segment is entirely irrelevant because in memory devices with double metal technology, they are housed in free and utilizable circuit portions.

Regulation of the drain voltage is optimal in case of parallel programming and thus ensures feasibility without complex compensation systems. The programming parallelism made possible by the voltage regulator in accordance with the present invention is very useful in the testing of the cell matrix. The parallelism can be pushed considerably with a resulting reduction in selection times. Lastly, the deactivation of the voltage regulator is provided by programming path interdiction transistors made possible by the particular structure of the regulator. The presence of a capacitor of adequate value on the output of the voltage regulator protects from overshoots both in the transitory phase and in the regulation regime to ensure stability of the voltage regulator circuit.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage regulator for programming electrically programmable non-volatile memory cells in a cell matrix that is divided in segments, the regulator comprising:

an amplifier stage connected and powered between a first reference voltage terminal that supplies a first reference voltage to a first power terminal of the amplifier and a second reference voltage terminal that supplies a second reference voltage to a second power terminal of the amplifier, the amplifier stage having a first input terminal connected to a voltage divider of the first reference voltage, an output terminal connected to a control terminal of a MOS transistor which has a conduction terminal connected to the memory cells through a programming line, and a second input terminal connected to the programming line and in feedback to the output terminal through the MOS transistor; and an input circuit portion made up of active elements and inserted between the first and second reference voltage terminals, the input circuit portion acting on a connection between the first power terminal of the amplifier and the first reference voltage terminal in response to at least one pair of signals to activate the regulator only when there is at least one cell to be programmed in the segment associated with the regulator.

2. The regulator of claim 1, wherein the input circuit portion includes a complementary pair of transistors and at least one enablement transistor, the complementary pair of transistors receiving a first programming enablement signal of the at least one pair of signals and the at least one enablement transistor receiving a second signal of the at least one pair of signals, the second signal indicating a presence of a bit to be programmed in the segment associated with the regulator.

3. The regulator of claim 1, further comprising a protective capacitor connected between the output of the amplifier and the second reference voltage terminal.

4. The regulator of claim 2, further comprising a pull-down transistor connected between the output of the amplifier and the second reference voltage terminal, the pull-down transistor having a control terminal that is connected to an output node of the complementary pair of transistors.

5. The regulator of claim 2, wherein the at least one enablement transistor includes a second enablement transistor, the second enablement transistor being connected in series with the at least one enablement transistor and receiving a second programming enablement signal.

6. The regulator of claim 1, further comprising a power transistor inserted between the first reference voltage terminal and the amplifier, wherein the input circuit portion acts on a control terminal of the power transistor.

7. The regulator of claim 6, wherein the power transistor is a PMOS power transistor in diode configuration.

8. The regulator of claim 4, further comprising a static and resistive pull-up transistor inserted between the first reference voltage terminal and the output node of the complementary pair of transistors, a control terminal of the pull-up transistor being connected to the output of the amplifier.

9. The regulator of claim 5, wherein each at least one enablement transistor is an NMOS transistor.

10. A memory that includes a plurality of electrically programmable non-volatile memory cells in a cell matrix that is divided into segments, each segment of the cell matrix including a voltage regulator for programming the memory cells of a respective segment, comprising:

an amplifier stage connected and powered between a first reference voltage terminal that supplies a first reference voltage and a second reference voltage terminal that supplies a second reference voltage, the amplifier stage having a first input terminal connected to a voltage divider of the first reference voltage, an output terminal connected to a control terminal of a MOS transistor which has a conduction terminal connected to the memory cells of the respective segment through a programming line, and a second input terminal connected to the programming line and in feedback to the output terminal through the MOS transistor; and an input circuit portion made up of active elements and inserted between the first and second reference voltage terminals, the circuit portion acting on a connection that is between the amplifier and the first reference voltage terminal and powers the amplifier in response to at least one pair of signals to activate the regulator only when there is at least one cell to be programmed in the respective segment.

11. A voltage regulator to provide a regulated programming voltage to a plurality of electrically programmable non-volatile memory cells arranged in cell matrix, each memory cell belonging to a respective one of a plurality of bit lines, memory cells belonging to a same bit line having a drain terminal that is commonly connected to form a common drain terminal, the voltage regulator comprising:

an output transistor having a first terminal that is coupled to a first reference voltage terminal, a second terminal that is coupled to the common drain terminal, and a control terminal;

a voltage divider coupled between the first reference voltage terminal and a second reference voltage terminal and having an output terminal to provide a divided output voltage, the voltage divider including
a first resistor;
a second resistor coupled in series to the first resistor;
a diode configured transistor that couples the first and second resistors to the second reference voltage terminal; and
a pair of series connected diode configured transistors that couple the first reference voltage terminal to the first and second resistors, a first of the pair of series connected diode configured transistors receiving an inverse of the programming enablement signal to operatively connect the first and second resistors between the first and second reference voltage terminals;

an amplifier having a first input that is coupled to the output terminal of the voltage divider, a second input that is coupled to the common drain terminal, and an output that is coupled to the control terminal of the output transistor and provides the regulated programming voltage; and a first switching circuit coupled between the first reference voltage terminal and the second reference voltage terminal to receive a programming enablement signal and operatively connect the amplifier to the first and second reference voltage terminals to provide the regulated programming voltage only when at least one of the plurality of memory cells is programmed.

12. The voltage regulator of claim 11, further comprising a capacitor coupled to the output of the amplifier and the second reference voltage terminal.

13. The voltage regulator of claim 11, wherein the first switching circuit operatively connects the amplifier when the programming enablement signal is asserted, and wherein the voltage regulator further comprises:

a second switching circuit, coupled between the output of the amplifier and the second reference voltage terminal, to receive an inverse of the programming enablement signal and operative connect the output of the amplifier to the second reference voltage terminal when the programming enablement signal is not asserted.

14. The voltage regulator of claim 13, wherein the cell matrix is divided into a plurality of segments, the voltage regulator is associated with a respective one of the plurality of segments, and wherein the first switching circuit includes:

a complementary pair of transistors including a first transistor and second transistor each having first and second terminals and a control terminal, the first terminal of the first transistor being coupled to the first reference voltage terminal, the second terminal of the first transistor being coupled to the first terminal of the second transistor and the control terminals of the first and second transistors being coupled together to receive the programming enablement signal; and a first enablement transistor having a first terminal that is coupled to the second terminal of the second transistor, a second terminal that is coupled to the second reference voltage terminal, and a control terminal to receive a second programming enablement signal indicative of whether the memory cell that is to be programmed is within the respective segment associated with the voltage regulator.

15. The voltage regulator of claim 14, wherein the first switching circuit further includes:

a second enablement transistor having a first terminal that is connected to the second terminal of the second transistor, a second terminal that is connected to the first terminal of the first enablement transistor, and a control terminal to receive a third programming enablement signal indicative of whether the memory cell that is to be programmed is within a particular portion of the respective segment associated with voltage regulator.

16. The voltage regulator of claim 14, wherein the first switching circuit further includes:

a supply transistor having a first terminal that is connected to the first reference voltage terminal, a second terminal that is connected to a first supply input of the amplifier, and a control terminal that is connected to the second terminal of the first transistor and the first terminal of the second transistor; and a static and resistive pull-up connected between the first reference voltage terminal and the output of the amplifier.

17. The voltage regulator of claim 16, wherein the static and resistive pull-up includes a pull-up transistor having a first terminal that is connected to the first reference voltage terminal, a second terminal that is connected to the control terminal of the supply transistor, a control terminal that is connected to the output of the amplifier and a body terminal that is connected to a body terminal of the supply transistor.

18. The voltage regulator of claim 16, further comprising a second output transistor having a first terminal that is connected to the first reference voltage, a second terminal that is connected to the first terminal of the output transistor and a control terminal that is connected to the second terminal of the first transistor and the first terminal of the second transistor.

19. The voltage regulator of claim 11, wherein the cell matrix is divided into a plurality of segments, the voltage regulator is associated with a respective one of the plurality of segments, and wherein the first switching circuit includes:

a complementary pair of transistors including a first transistor and second transistor each having first and second terminals and a control terminal, the first terminal of the first transistor being coupled to the first voltage reference terminal, the second terminal of the first transistor being coupled to the first terminal of the second transistor and the control terminals of the first and second transistors being coupled together to receive the programming enablement signal; and an enablement transistor having a first terminal that is coupled to the second terminal of the second transistor, a second terminal that is coupled to the second voltage reference terminal, and a control terminal to receive a second programming enablement signal indicative of whether the memory cell that is to be programmed is within the respective segment associated with voltage regulator.

20. A method of providing a regulated programming voltage to an electrically programmable non-volatile memory cell arranged in a cell matrix, the cell matrix being divided into a plurality of segments, the method comprising the steps of:

generating a divided voltage from a programming voltage;

receiving a first signal indicative of a programming phase;

determining whether the memory cell is arranged in a respective segment of the cell matrix that is associated with a respective amplifier; and operatively connecting, in response to the steps of receiving and determining, the respective amplifier between a pair of voltage supply terminals to provide the regulated programming voltage to the memory cell when the memory cell is determined to be arranged in the respective segment of the cell matrix;

wherein the step of generating includes a step of generating the divided voltage only when the first signal indicates the programming phase.

21. The method of claim 20, further comprising a step of operatively connecting an output of the amplifier to one of the pair of voltage supply terminals when the memory cell is determined not to be arranged in the respective segment of the cell matrix.

22. The method of claim 21, wherein the step of operatively connecting an output of the amplifier to the one of the pair of voltage supply terminals includes a step of minimizing a power consumed by the amplifier.

23. The method of claim 21, further comprising a step of operatively connecting an output of the amplifier to the one of the pair of voltage supply terminals when the first signal is not received.

24. The method of claim 20, further comprising a step of operatively connecting an output of the amplifier to one of the pair of voltage supply terminals when the first signal is not received.

25. The method of claim 20, wherein an output of the amplifier is coupled to a programming line of the memory cell and the method further comprises a step of stabilizing the regulated programming voltage dependent on an amount of current consumed by the programming line.

26. The method of claim 20, further comprising a step of minimizing high frequency overshoots in the regulated programming voltage.

27. An electrically programmable non-volatile memory comprising:
   a plurality of electrically programmable non-volatile memory cells arranged in a cell matrix, the cell matrix being divided into a plurality of segments, each memory cell belonging to a respective segment of the plurality of segments, each memory cell having a drain terminal that is coupled to a respective one of a plurality of bit lines, memory cells belonging to a same bit line having drain terminals that are commonly connected and form a common drain terminal;
   an output transistor having a first terminal that is coupled to a first reference voltage terminal, a second terminal that is coupled to the common drain terminal, and a control terminal;
   a voltage divider coupled between the first reference voltage terminal and a second reference voltage terminal and having an output terminal to provide a divided output voltage, the voltage divider including
      a first resistor;
      a second resistor coupled in series to the first resistor;
      a diode configured transistor that couples the first and second resistors to the second reference voltage terminal; and
      a pair of series connected diode configured transistors that couple the first reference voltage terminal to the first and second resistors, a first of the pair of series connected diode configured transistors receiving an inverse of the programming enablement signal to operatively connect the first and second resistors between the first and second reference voltage terminals; and
   means, coupled to the output terminal of the voltage divider and the control terminal of the output transistor, for individually regulating a programming voltage provided to the common drain terminal of the respective segment.

28. The electrically programmable memory of claim 27, wherein the means for individually regulating the programming voltage includes:
   an amplifier having an inverting input, a non-inverting input that is coupled to the output terminal of the voltage divider, and an output that is coupled to the control terminal of the output transistor; and
   negative feedback means, coupling the output of the amplifier to the inverting input, for regulating the programming voltage by stabilizing the programming voltage based upon an amount of current consumed by the common drain terminal.

29. The electrically programmable memory of claim 28, further comprising means, coupled between the output of the amplifier and the second reference voltage terminal, for minimizing high frequency overshoots in the programming voltage.

30. The electrically programmable memory of claim 28, wherein the electrically programmable memory includes a plurality of amplifiers, each amplifier being respectively associated with a corresponding segment, and wherein the electrically programmable memory further includes means for selecting the amplifier corresponding to the respective segment when one of the plurality of memory cells to be programmed belongs to the respective segment.

31. The electrically programmable memory of claim 30, wherein the means for selecting includes means for individually selecting the amplifier corresponding to the respective segment independently of other amplifiers of the plurality of amplifiers.

* * * * *